United States Patent
Okazaki et al.

(10) Patent No.: US 10,074,684 B2
(45) Date of Patent: Sep. 11, 2018

(54) IMAGE PICKUP DEVICE WITH PIXELS HAVING NON-INTERSECTING SUBSTRATE TRENCHES THEREBETWEEN

(71) Applicant: SONY CORPORATION, Tokyo (JP)

(72) Inventors: Hiromi Okazaki, Kanagawa (JP); Masayuki Uchiyama, Kanagawa (JP); Kazufumi Watanabe, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/401,396

(22) PCT Filed: May 16, 2013

(86) PCT No.: PCT/JP2013/003135
§ 371 (c)(1),
(2) Date: Nov. 14, 2014

(87) PCT Pub. No.: WO2013/175742
PCT Pub. Date: Nov. 28, 2013

(65) Prior Publication Data
US 2015/0091122 A1     Apr. 2, 2015

(30) Foreign Application Priority Data

May 23, 2012   (JP) .................................. 2012-117194

(51) Int. Cl.
*H01L 27/146*     (2006.01)
(52) U.S. Cl.
CPC .............................. *H01L 27/1463* (2013.01)
(58) Field of Classification Search
CPC ......... H01L 27/14603; H01L 27/14607; H01L 27/1463; H01L 27/14612; H01L 27/14614; H01L 27/14621; H01L 27/14638; H01L 27/14641; H01L 27/14643; H01L 27/14583; H01L 27/1464; H01L 27/14689;
(Continued)

(56) References Cited

U.S. PATENT DOCUMENTS

| 6,177,293 | B1 | 1/2001 | Netzer et al. | |
| 7,244,978 | B2* | 7/2007 | Nishimura | ........ H01L 27/14806 257/291 |
| 2004/0132262 | A1* | 7/2004 | Ayabe | ............... H01L 27/14603 438/428 |
| 2005/0179053 | A1* | 8/2005 | Ezaki | ................ H01L 27/14603 257/189 |
| 2009/0266973 | A1* | 10/2009 | Roy | .................... H01L 27/1463 250/206 |

(Continued)

FOREIGN PATENT DOCUMENTS

| EP | 2216818 A2 | 8/2010 |
| EP | 2320463 A1 | 5/2011 |

OTHER PUBLICATIONS

International Search Report and Written Opinion prepare by the European Patent Office dated Jul. 24, 2013, for International Application No. PCT/JP2013/003135.

*Primary Examiner* — Marc Armand
*Assistant Examiner* — Younes Boulghassoul
(74) *Attorney, Agent, or Firm* — Chip Law Group

(57) ABSTRACT

Systems and methods for providing a solid state image sensor (30) are provided. More particularly, an image sensor (30) that suppresses color mixing is provided. Moreover, embodiments of the present disclosure provide for the creation of light blocking features (32) that avoid the creation of stress concentrations. More particularly, embodiments of the present disclosure provide for the creation of light blocking structures (32) using trenches formed in a substrate (44) that are arranged such that no two trenches intersect one another.

18 Claims, 20 Drawing Sheets

(58) Field of Classification Search
CPC .......... H01L 27/14627; H01L 29/4238; H01L 29/49; H01L 31/101; H01L 31/14; H01L 31/0304; H01L 31/0322; H01L 31/02325; H01L 31/18; H01L 31/062; H01L 51/5281; H01L 51/5275; H01L 31/01; H01L 31/0328; H04N 5/232; H04N 5/335; H04N 5/359; H04N 9/045; H04N 5/369; H04N 5/374; H04N 5/37457; G01J 1/44
USPC ....... 257/292, 294, 432, 443, 446, 206, 435, 257/189, 290, 436, E31.054, E31.097; 348/294, 298, 302, 312; 438/73, 57, 72, 438/70, 85

See application file for complete search history.

(56) References Cited

U.S. PATENT DOCUMENTS

| | | | |
|---|---|---|---|
| 2010/0144084 A1* | 6/2010 | Doan ................ | G02B 6/12004 438/72 |
| 2010/0163889 A1* | 7/2010 | Park ................ | H01L 31/14 257/84 |
| 2011/0019050 A1* | 1/2011 | Yamashita .......... | H01L 27/1463 348/308 |
| 2011/0108939 A1* | 5/2011 | Marty ................ | H01L 27/1463 257/432 |
| 2012/0032241 A1* | 2/2012 | Huang .............. | H01L 27/14623 257/290 |
| 2012/0217521 A1* | 8/2012 | Ohta ................ | H01L 51/5281 257/89 |
| 2013/0277093 A1* | 10/2013 | Sun .................... | H01L 25/0753 174/252 |

* cited by examiner

TRENCH CROSSING PORTION

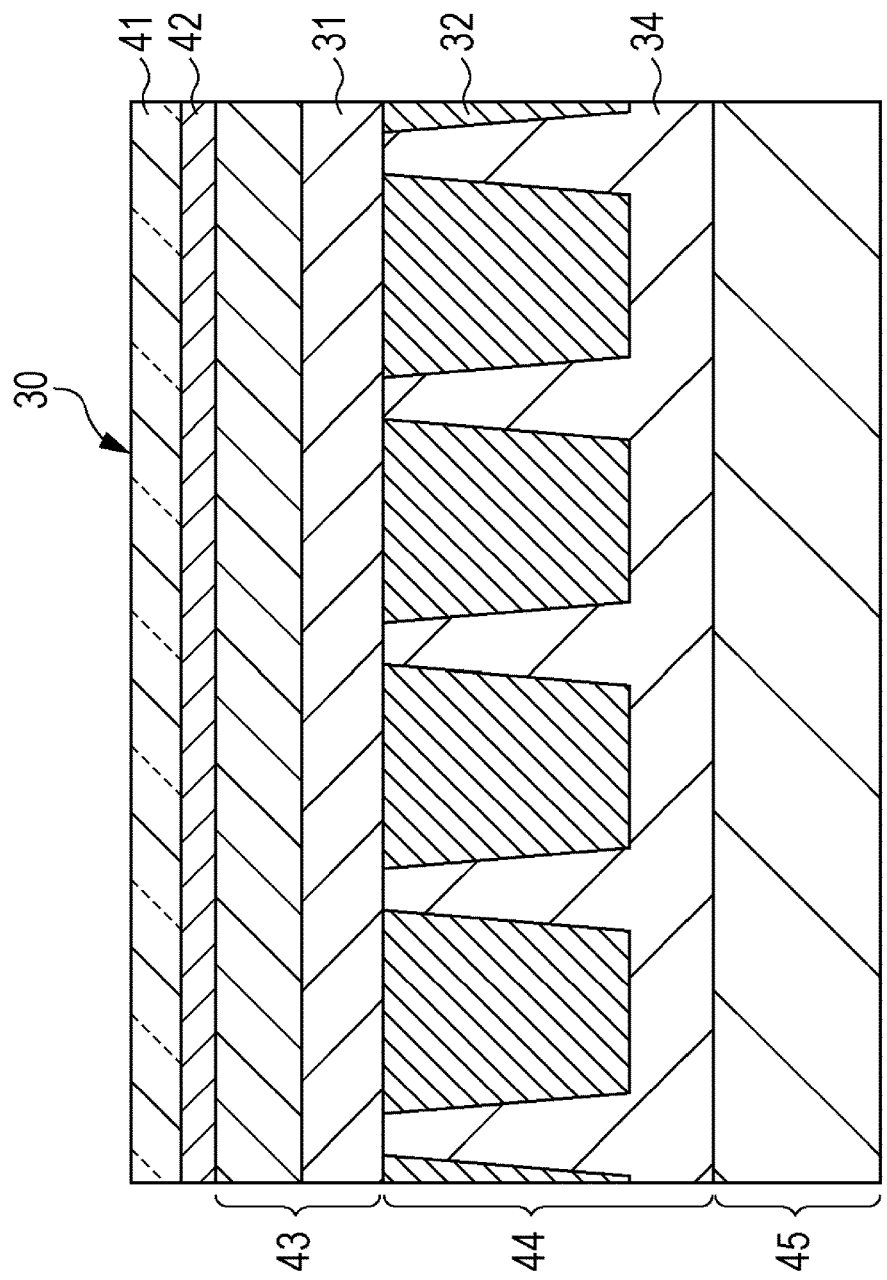

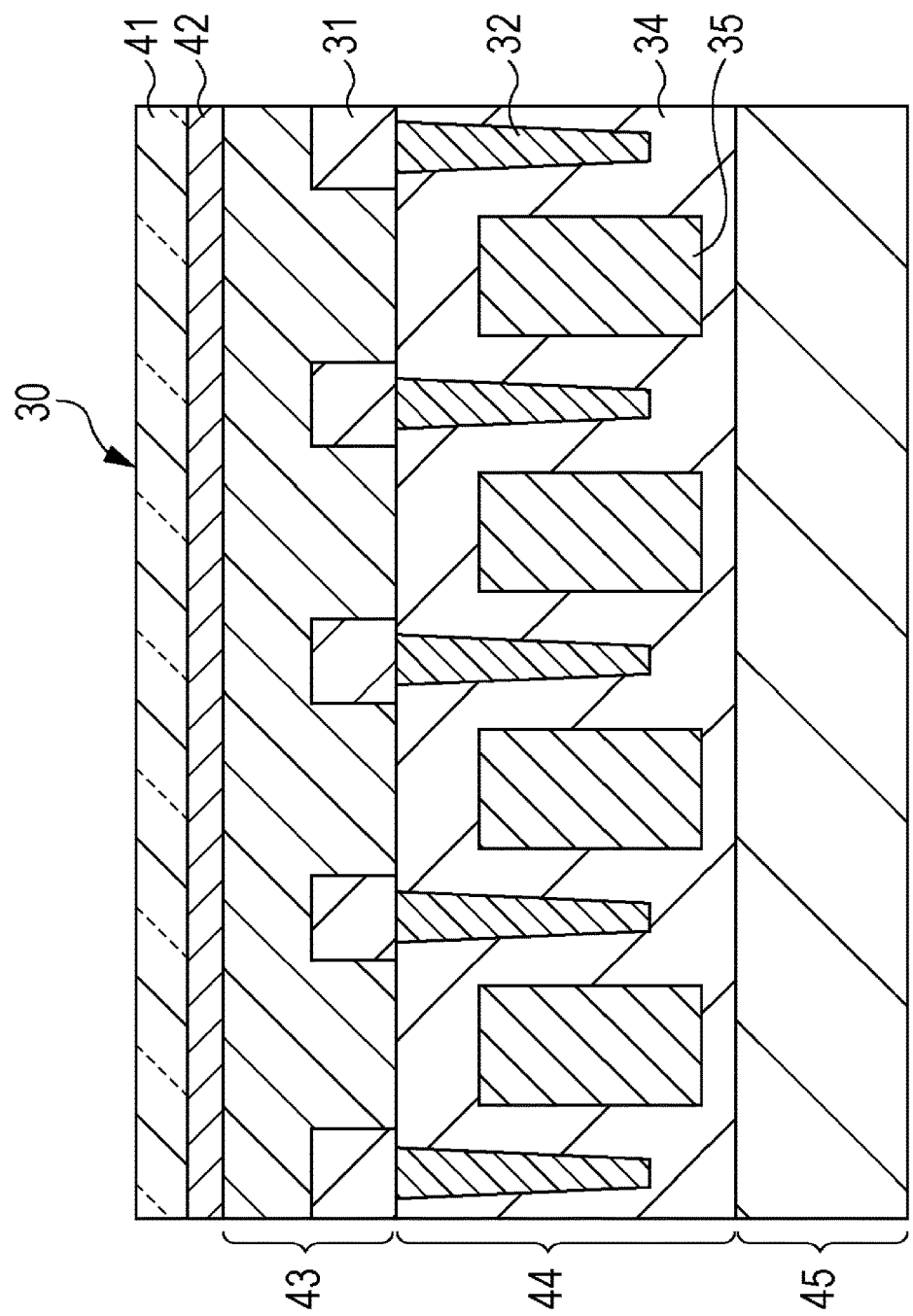

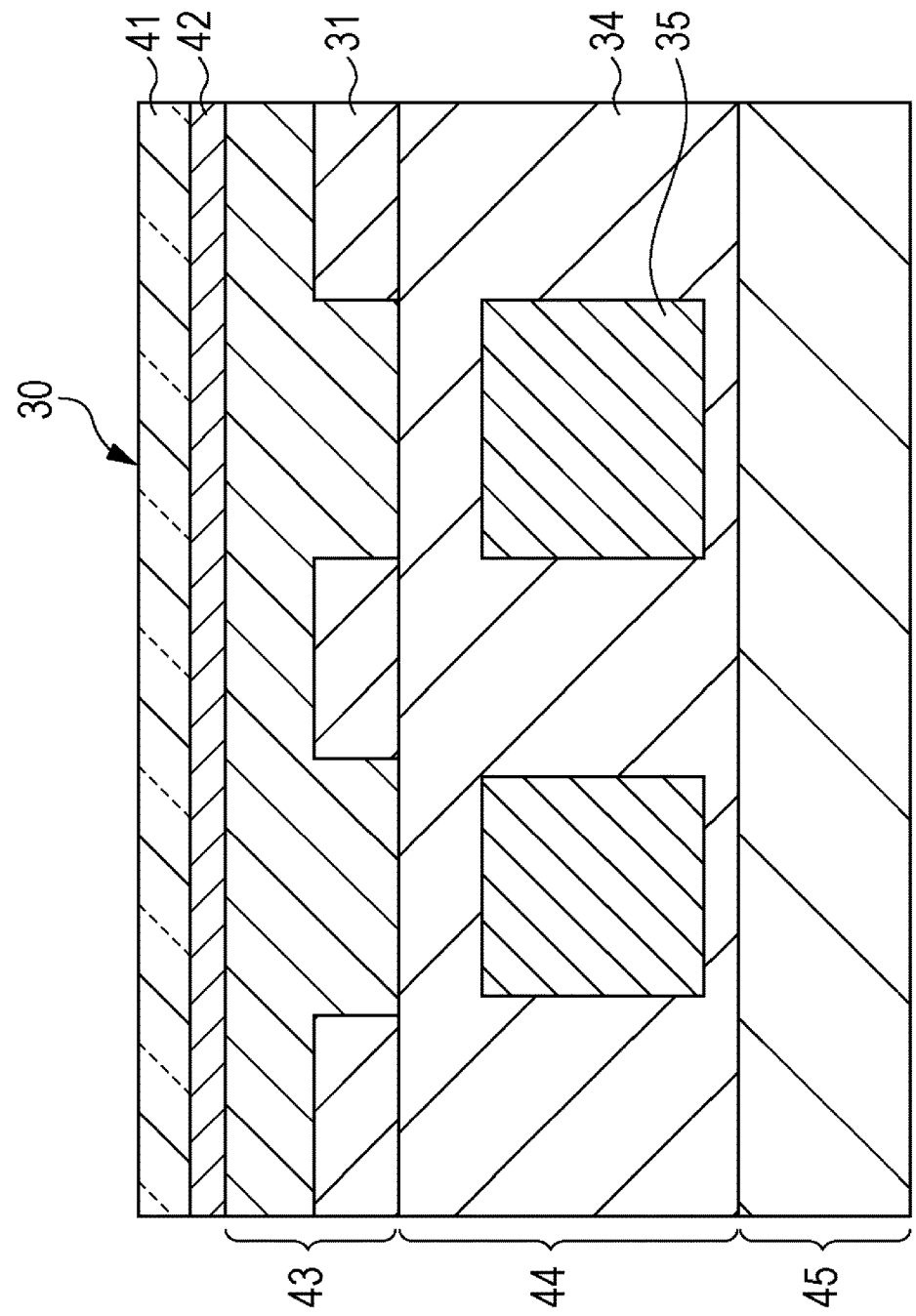

IMAGE PICKUP DEVICE WITH PIXELS HAVING NON-INTERSECTING SUBSTRATE TRENCHES THEREBETWEEN

CROSS REFERENCE TO RELATED APPLICATIONS

This application is a national stage application under 35 U.S.C. 371 and claims the benefit of PCT Application No. PCT/JP2013/003135 having an international filing date of May 16, 2013, which designated the United States, which PCT application claimed the benefit of Japanese Patent Application No. 2012-117194 filed May 23, 2012, the disclosures of each of are incorporated herein by reference.

TECHNICAL FIELD

The present disclosure relates to image pickup elements and image pickup devices, and more particularly, to an image pickup element and an image pickup device with which color mixing of an image signal obtained by the image pickup element is suppressed and the S/N ratio of the image signal is increased.

BACKGROUND ART

Complementary metal oxide semiconductor (CMOS) image sensors (hereinafter referred to as CIS) are used as image pickup elements in, for example, digital still cameras and digital video cameras. With the increase in the number of pixels and reduction in optical size of the CIS, the pixel size has been reduced and the pixel density has been increased.

As a result of the reduction in pixel size and increase in pixel density, sensitivity per unit pixel has been reduced and there is a possibility that a signal-to-noise (S/N) ratio will be reduced and image quality will be degraded. In addition, since the distance between the adjacent pixels has been reduced, there is a possibility that pixels expected to receive only light in a specific wavelength range (for example, green light) will receive light in other wavelength ranges (for example, red or blue light) and color mixing will occur, which leads to a reduction in color reproducibility.

To solve the above-described problems, a back-illuminated CIS in which a grid-shaped light-shielding material is arranged so as to extend between the adjacent pixels has been proposed. In this back-illuminated CIS, light is incident on a back surface at the side opposite to a front surface on which a wiring layer is formed, and the incident light reaches a photodiode (PD) region of a silicon (Si) substrate without being blocked by the wiring layer. Therefore, the reduction in sensitivity per unit pixel can be suppressed.

In addition, obliquely incident light is reflected by the grid-shaped light-shielding material arranged so as to extend between the adjacent pixels, and is suppressed from being incident on pixels other than the pixels on which the light is expected to be incident. As a result, color mixing can be reduced and reduction in color reproducibility can be suppressed.

SUMMARY OF INVENTION

The present disclosure provides an image pickup element in which color mixing of an image signal can be suppressed, the S/N ratio of the image signal can be increased, and reduction in pixel size and increase in pixel density can be achieved at a practically applicable level.

According to an embodiment of the present disclosure, there is provided an image pickup device including a substrate, a plurality of pixels formed in the substrate, and a plurality of trenches formed in the substrate and extending at least partially between pairs of pixels included in the plurality of pixels. According to an embodiment of the present disclosure, at least two trenches in the plurality of trenches are formed along at least a first line that extends between a plurality of pixels. In accordance with still other embodiments, no two trenches cross one another.

The device can additionally include a substrate light shielding material that fills the plurality of trenches. In accordance with further embodiments, at least one pixel in the plurality of pixels is not completely surrounded by the substrate light shielding material. The substrate light shielding material can further define a perimeter that substantially surrounds each pixel in the plurality of pixels, and with respect to each pixel in the plurality of pixels there is at least one gap in the perimeter formed by the substrate light shielding material.

The image pickup device can further include an upper layer light shielding material. The upper layer light shielding material and the substrate light shielding material can be made from an insulating material, including but not limited to silicon oxide, titanium oxide, silicon nitride, aluminum oxide, tantalum oxide, or hafnium oxide, or a metal material including but not limited to tungsten, aluminum, titanium nitride, titanium, or copper.

In accordance with at least some embodiments, at least two trenches are formed along at least a second line that extends between a plurality of pixels. The first line can be one of parallel to and perpendicular to the second line. In accordance with still other embodiments, the plurality of pixels are arranged in rows and columns, wherein the first line extends between one of two adjacent rows of pixels and two adjacent columns of pixels. In accordance with still further embodiments, each pixel can be associated with at least four trenches.

According to a further embodiment, an image pickup device is provided that includes a substrate, a plurality of pixels, and a plurality of trenches. The plurality of trenches are formed in the substrate, wherein at least some of the trenches are between adjacent pairs of pixels, and wherein no one trench extends across any other trench.

At least some of the trenches included in the plurality of trenches can be formed along a first plurality of parallel lines, wherein more than one trench included in the plurality of trenches is formed along each line in the first plurality of lines. In accordance with still other embodiments, at least some of the trenches are formed along a second plurality of parallel lines, wherein only trench is formed along each line in the second plurality of lines. The plurality of pixels can be arranged in rows and columns, wherein the first plurality of parallel lines extend between one of adjacent rows of pixels and adjacent columns of pixels.

The image pickup device can additionally include a substrate light shielding material, wherein the trenches in the plurality of trenches are filled with the substrate light shielding material.

The image pickup device can also include an upper layer light shielding material, wherein the upper layer light shielding material extends between the pixels.

The substrate light shielding material and the upper layer light shielding material can be made of an insulating material including at least one of silicon oxide, titanium oxide, silicon nitride, aluminum oxide, tantalum oxide, or hafnium oxide, or a metal material such as tungsten, aluminum, titanium nitride, titanium, or copper.

In accordance with still other embodiments, an imaging device including a substrate, a plurality of pixels, a plurality of trenches, and a substrate light shielding material is provided. The plurality of pixels are formed in the substrate. The plurality of trenches are formed in the substrate, and at least some of the trenches extend between pairs of the pixels. The substrate light shielding material fills the trenches included in the plurality of trenches, wherein with respect to each pixel in the plurality of pixels there exists at least one gap in the substrate light shielding material.

The plurality of pixels can be arranged in rows in columns with respect to a light incident side of the substrate. Moreover, each trench in the plurality of trenches does not intersect any other trench.

In accordance with embodiments of the present disclosure, color mixing between the pixels can be suppressed, the S/N ratio can be increased, and a reduction in pixel size and an increase in pixel density can be achieved at a practically applicable level.

According to further embodiments of the present disclosure, an image can be captured such that color mixing between the pixels is suppressed, the S/N ratio is increased, and a reduction in pixel size and an increase in pixel density are achieved at a practically applicable level.

Additional features and advantages of embodiments of the present disclosure will become more readily apparent from the following description, particularly when taken together with the accompanying drawings.

BRIEF DESCRIPTION OF DRAWINGS

FIG. 4 is a sectional view of the back-illuminated CIS illustrated in FIGS. 3A and 3B taken along line IV-IV;

FIG. 5 is a sectional view of the back-illuminated CIS illustrated in FIGS. 3A and 3B taken along line V-V;

FIG. 6 is a sectional view of the back-illuminated CIS illustrated in FIGS. 3A and 3B taken along line VI-VI;

DESCRIPTION OF EMBODIMENTS

Figure 1:
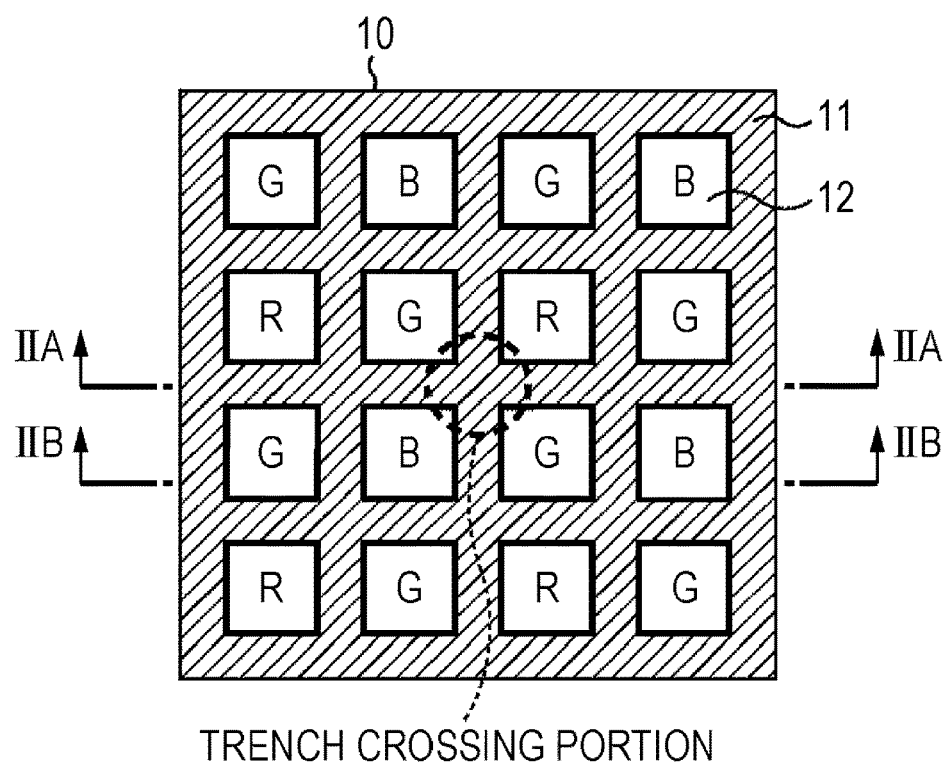
FIG. 1 illustrates a conventional back-illuminated CIS viewed from a light incident side.
Figure 2A:
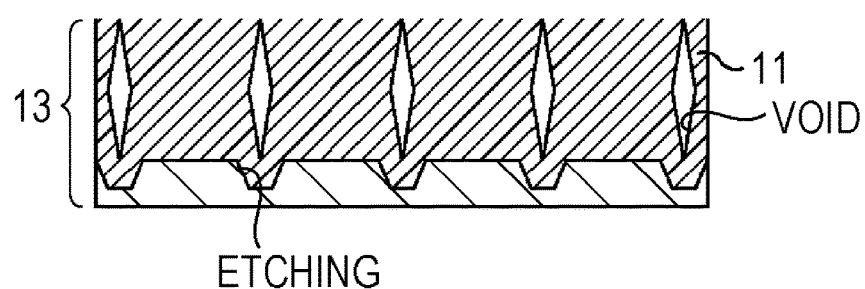
FIG. 2A is a sectional view of the conventional back-illuminated CIS illustrated in FIG. 1 taken along line IIA-IIA.
Figure 2B:
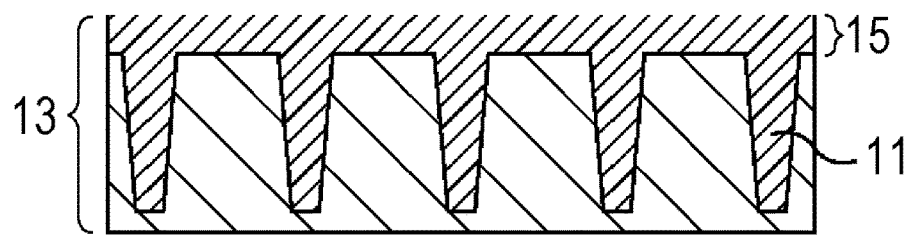
FIG. 2B is a sectional view of the conventional back-illuminated CIS illustrated in FIG. 1 taken along line IIB-IIB.

FIG. 1 illustrates a conventional back-illuminated CIS viewed from a light incident side, the back-illuminated CIS including a grid-shaped light-shielding material arranged so as to extend between the adjacent pixels. FIGS. 2A and 2B are sectional views of the back-illuminated CIS 10 illustrated in FIG. 1 taken along lines IIA-IIA and IIB-IIB, respectively.

The conventional back-illuminated CIS 10 includes a grid-shaped trench (groove) formed so as to extend between pixels 12 on a silicon (Si) substrate 13 having a photodiode (PD) region in which photoelectric conversion is performed. The trench is filled with a light-shielding material 11.

In the back-illuminated CIS 10, color mixing is reduced and reduction in color reproducibility is suppressed owing to the grid-shaped light-shielding material 11 arranged so as to extend between the adjacent pixels 12. However, the grid-shaped trench includes vertical and horizontal trenches that intersect at crossing portions (hereinafter referred to as trench crossing portions), and various problems occur at the trench crossing portions.

That is, owing to the light-shielding material 11 which fills the trench crossing portions, stress concentration may occur in the Si substrate 13 in regions surrounding the trench crossing portions and serve as a source of noise in the image signal.

As illustrated in FIG. 2A, the Si substrate 13 tends to be relatively deeply etched at the trench crossing portions. Accordingly, defects may occur in the trench crossing portions and serve as a source of noise in the image signal.

When the grid-shaped trench is filled with the light-shielding material 11, voids are more easily formed in the trench crossing portions than in portions other than the trench crossing portions. It is therefore difficult to uniformly fill the grid-shaped trench with the light-shielding material 11 over the entire region thereof.

As illustrated in FIG. 2B, a relatively thick insulating film (film of light-shielding material) 15 is formed on the Si substrate 13 when the grid-shaped trench is filled with the light-shielding material 11. The insulating film 15 degrades the color mixing characteristics when light is obliquely incident thereon.

The thickness of the insulating film 15 on the Si substrate 13 can be reduced by a chemical mechanical polishing (CMP) process. However, the CMP process is not suitable for mass production since the number of steps and cost will be increased.

According to the present disclosure, the above-described problems can be solved without performing the CMP process in the production of the back-illuminated CIS.

EMBODIMENT

<First Exemplary Structure of a Back-Illuminated CIS>

Figure 3A:
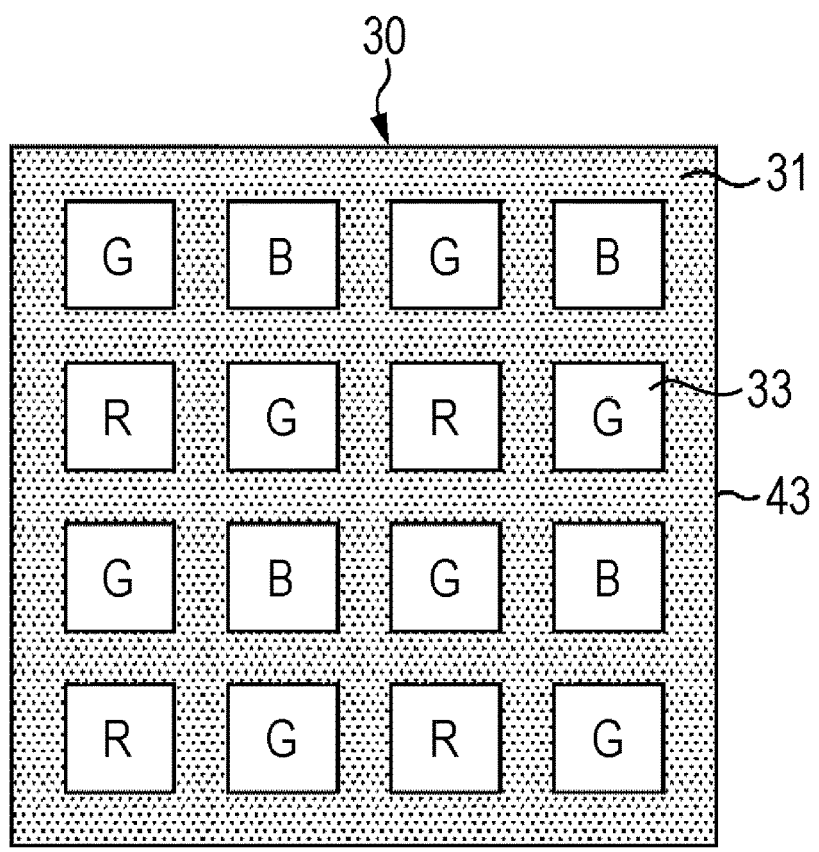
FIG. 3A illustrates an upper Si layer of a back-illuminated CIS in accordance with embodiments of the present disclosure, viewed from a light incident side.
Figure 3B:
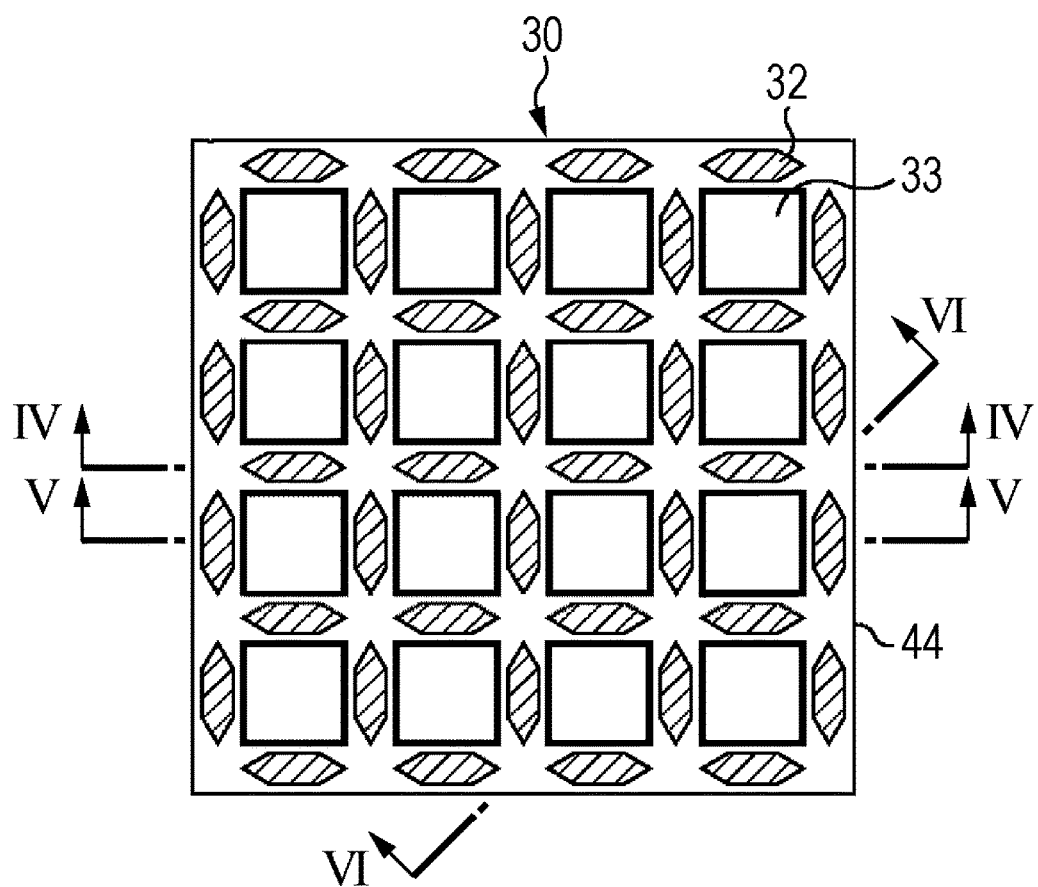
FIG. 3B illustrates a Si substrate of the back-illuminated CIS in accordance with embodiments of the present disclosure, viewed from a light incident side.

FIGS. 3A and 3B illustrate a back-illuminated CIS 30 according to an embodiment of the present disclosure viewed from a light incident side. FIG. 3A illustrates an upper Si layer 43 and FIG. 3B illustrates a Si substrate 44. The back-illuminated CIS 30 has a six-layer structure including an on-chip lens 41, a color filter 42, the Si upper layer 43, the Si substrate 44, and a wiring layer 45 (see FIG. 4) in that order from the light incident side.

As shown in FIGS. 3A and 3B, the pixels 33 of the back-illuminated CIS 30 can be arranged in rows and columns so as to form a lattice-type array. White squares in FIGS. 3A and 3B show the positions of pixels 33, and 'R', 'G', and 'B' written in the white squares in FIG. 3A represent the wavelength ranges of light received by the pixels 33. In the present embodiment, R, G, and B are arranged in a Bayer pattern. However, the arrangement of R, G, and B is not limited to this pattern. In addition, three primary colors are not limited to R, G, and B, and another color, such as white (W), may be additionally used. This also applies to other embodiments of the present disclosure, including but not limited to those in the following drawings.

As illustrated in FIG. 3A, the Si upper layer 43 (layer on the Si substrate 44) includes a grid-shaped Si-upper-layer light-shielding material 31 formed so as to extend between the pixels 33.

As illustrated in FIG. 3B, vertical and horizontal trenches (grooves) are formed in the Si substrate 44 so as to extend between the adjacent pixels 33 and so that no trench crossing portions are formed. The trenches are filled with a Si-substrate light-shielding material 32, which is made of a light-shielding material.

The Si-upper-layer light-shielding material 31 and the Si-substrate light-shielding material 32 may be made of, for example, an insulating material such as silicon oxide, titanium oxide, silicon nitride, aluminum oxide, tantalum oxide, or hafnium oxide, or a metal material such as tungsten, aluminum, titanium nitride, titanium, or copper.

FIGS. 4, 5, and 6 are sectional views of the back-illuminated CIS 30 illustrated in FIGS. 3A and 3B taken along lines IV-IV, V-V, and VI-VI, respectively.

As described above, the back-illuminated CIS 30 has a six-layer structure including the on-chip lens 41, the color filter 42, the Si upper layer 43, the Si substrate 44, and the wiring layer 45 in that order from the light incident side.

The on-chip lens 41 collects light incident thereon and directs the incident light to photoelectric converters included in the Si substrate 44. The color filter 42 transmits only light in specific wavelength ranges. The Si upper layer 43 includes the Si-upper-layer light-shielding material 31. The Si substrate 44 has a photodiode (PD) region in which a P-type diffusion layer 34 and an N-type diffusion layer 35 are arranged. The wiring layer 45 outputs electric charges generated in the PD region to a subsequent stage as an electrical signal.

As shown in FIGS. 4 to 6, in the back-illuminated CIS 30, the trenches are formed in the Si substrate 44 so that no trench crossing portions are formed, and are filed with the Si-substrate light-shielding material 32. Therefore, the problems due to the trench crossing portions in the back-illuminated CIS 10 according to the related art do not occur.

Although not illustrated, the edges in the Si substrate 44 may be formed so as to extend through the Si substrate 44 in a partial or entire area of the Si substrate 44.

Figure 7:
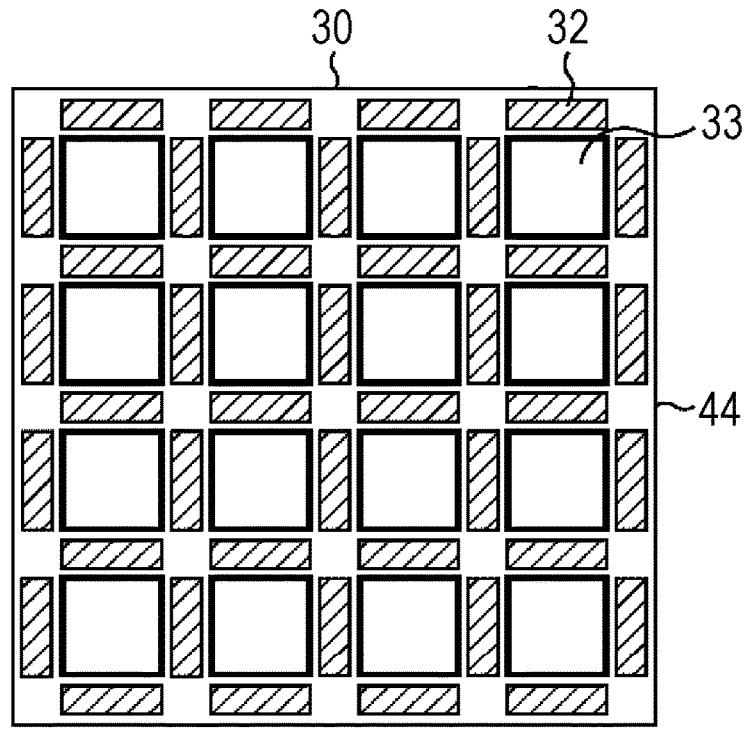
FIG. 7 illustrates a first modification including a modified trench shape in accordance with embodiments of the present disclosure.

FIG. 7 illustrates an embodiment of the present disclosure with a modification to the shape of the ends of the trenches formed in the Si substrate 44. Specifically, although the trenches shown in FIG. 3B have pointed ends, the trenches may instead have flat ends as illustrated in FIG. 7. Alternatively, although not illustrated, the trenches may instead have arc-shaped or concave ends.

Figure 8:
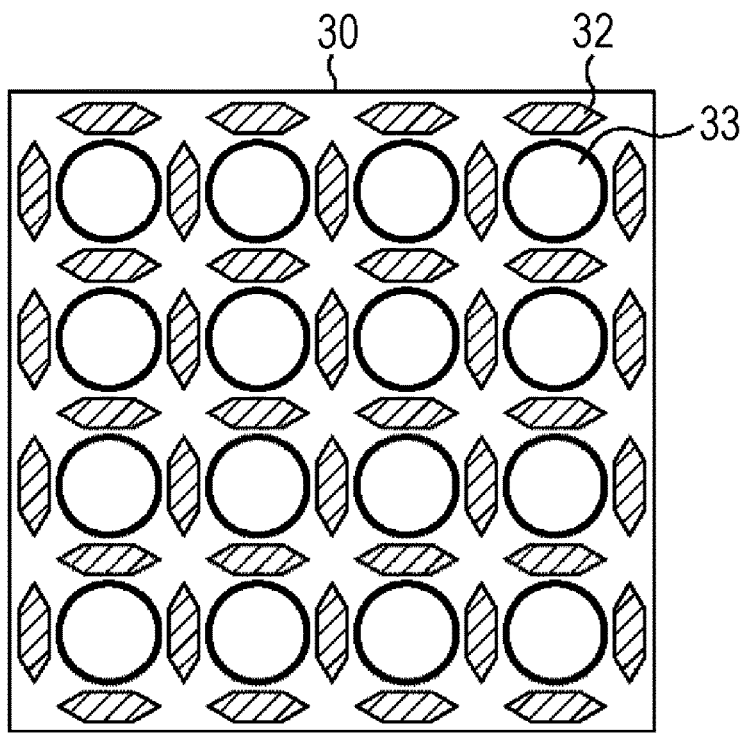
FIG. 8 illustrates a second modification including a modified pixel shape in accordance with embodiments of the present disclosure.

FIG. 8 illustrates an embodiment of the present disclosure with a modification to the shape of the pixels (Si substrate openings). Specifically, although the pixels (Si substrate openings) 33 are square-shaped in FIGS. 3A and 3B, the pixels (Si substrate openings) 33 may instead be circular shaped, as illustrated in FIG. 8. Alternatively, although not illustrated, the pixels (Si substrate openings) 33 may instead be diamond or polygonal shaped. The light shielding performance of oblique portions may be increased by forming the pixels (Si substrate openings) 33 in a circular or polygonal shape.

Figure 9:
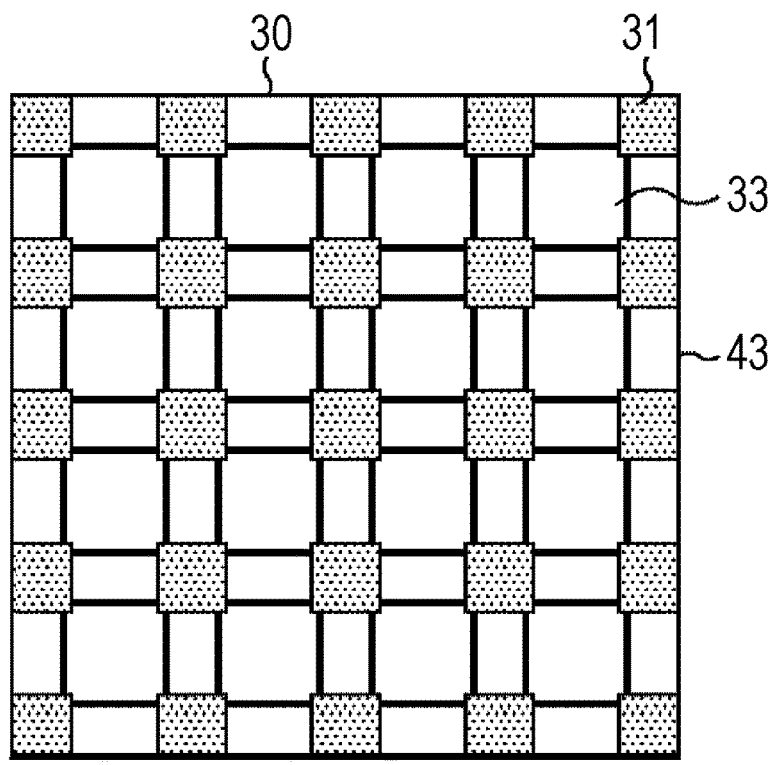
FIG. 9 illustrates a third modification including a modified Si upper layer in accordance with embodiments of the present disclosure.

FIG. 9 illustrates an embodiment of the present disclosure with a modification to the shape of the Si-upper-layer light-shielding material 31 included in the Si upper layer 43. Specifically, although the Si-upper-layer light-shielding material 31 is grid-shaped in FIG. 3A, the Si-upper-layer light-shielding material 31 may instead be provided only at locations where the Si-substrate light-shielding material 32 is not provided (that is, locations corresponding to trench crossing portions), as illustrated in FIG. 9. In this case, the area of the Si substrate openings 33 is increased, so that the sensitivity of the PD region may be increased. Although not illustrated, the width of the Si-upper-layer light-shielding material 31 may be smaller than or equal to the width of the Si-substrate light-shielding material 32. The width may also be partially changed.

Figure 10:
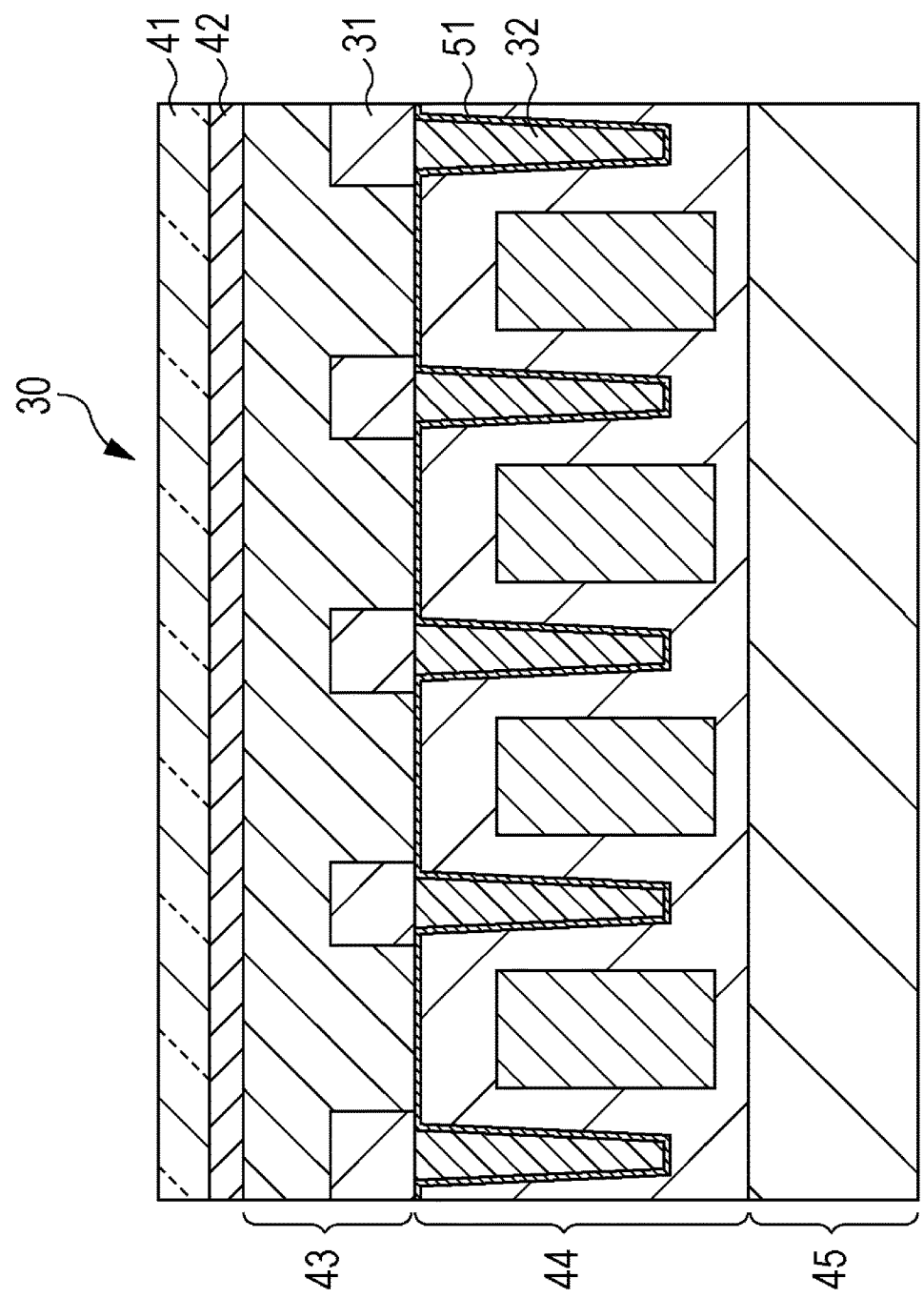
FIG. 10 illustrates a fourth modification with a charge-fixed film in accordance with embodiments of the present disclosure.

FIG. 10 illustrates an embodiment of the present disclosure with a modification in which a charge-fixed film 51 is additionally provided. The charge-fixed film 51, which has a negative fixed charge, may be provided around the Si-substrate light-shielding material 32 and on the back surface (upper surface in FIG. 10) of the Si substrate 44. In this case, an inversion layer is formed on a Si boundary surface that is in contact with the charge-fixed film 51. Holes in the inversion layer recombine with electrons in a dark current that may be generated along the boundary surface, so that the influence of the dark current may be suppressed.

An improvement of color mixing characteristics will now be described. As described above, the back-illuminated CIS 30 illustrated in FIGS. 3A and 3B includes no trench crossing portions, which serve as a noise source (source of white spot or dark current).

However, since there are regions in which no trenches are formed, electrons generated by photoelectric conversion easily pass through those regions and travel between the adjacent pixels. As a result, the color-mixing suppressing effect provided by the trenches is reduced. This will be described in more detail with reference to the drawings.

Figure 11:
FIG. 11 is a graph showing the color mixing characteristics with respect to the incident angle.

FIG. 11 is a graph showing the color mixing characteristics with respect to the incident angle of light. The horizontal axis represents the incident angle of light. The vertical axis represents the result of subtraction of the ratio of an output from a red (R) pixel to an output from a green (G) pixel when green (G) light is incident at 0 degrees from the ratio of an output from the red (R) pixel to an output from the green (G) pixel when green (G) light is incident at various incident angles.

The curve L1 in the graph shows the color mixing characteristics of a back-illuminated CIS in which a grid-shaped trench is formed so as to extend between pixels. The curve L2 in the graph shows the color mixing characteristics of a back-illuminated CIS in which a grid-shaped trench is formed so as to extend between pixels and the thickness of an insulating film (film of light-shielding material) formed on a Si substrate and made of a light-shielding material with which the trench is filled is reduced by a chemical mechanical polishing (CMP) process. The curve L3 in the graph shows the color mixing characteristics of the back-illuminated CIS 30 illustrated in FIGS. 3A and 3B.

In the graph, the higher the values along the vertical axis, the greater the degradation of the color mixing characteristics. In other words, the color mixing characteristics are improved as the upward opening of the U-shaped curves L1 to L3 is increased.

Therefore, the color mixing characteristics of the back-illuminated CIS 30 illustrated in FIGS. 3A and 3B are worse than those of the back-illuminated CIS in which the grid-shaped trench is formed so as to extend between the pixels. Modifications in which the color mixing characteristics are improved without forming the trench crossing portions will now be described.

Figure 12A:
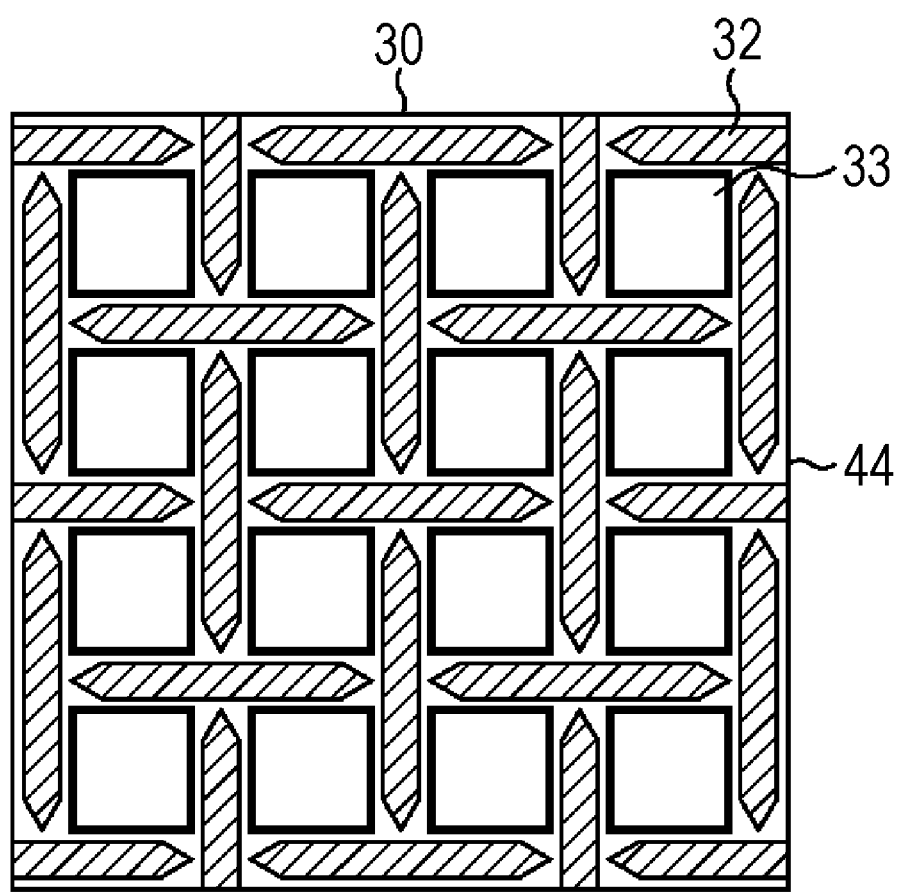
FIG. 12A illustrates an example of a fifth modification with modified trenches in accordance with other embodiments of the present disclosure.
Figure 12B:
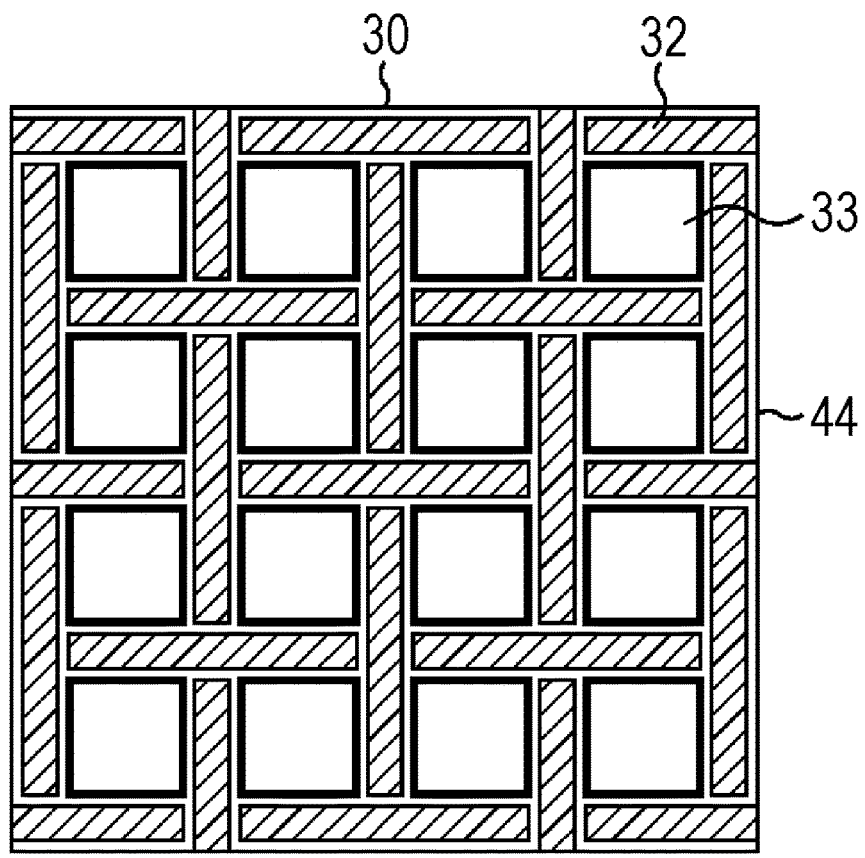
FIG. 12B illustrates another example of the fifth modification with modified trenches in accordance with other embodiments of the present disclosure.

FIGS. 12A and 12B illustrate examples of a modification in which trenches extending in vertical and horizontal directions are alternately arranged in a grid-shaped region that extends between the pixels. FIG. 12A shows the case in which the trenches have pointed ends. FIG. 12B shows the case in which the trenches have flat ends.

In either case, no trench crossing portions are provided. Therefore, the problems in conventional arrangements due to the trench crossing portions do not occur. Since the area in which no trenches are formed is reduced compared to that in the case of FIG. 3B, the color mixing characteristics are improved compared to those in the case of FIG. 3B. In addition, the trenches are longer than those in the case of FIG. 3B, and therefore can be more easily formed. Accordingly, the present modification is suitable for a case in which the overall size of the back-illuminated CIS 30 is reduced.

Figure 13:
FIG. 13 is a graph showing the color mixing characteristics with respect to the incident angle.

FIG. 13 is a graph in which a curve L4 showing the color mixing characteristics according to the fifth modification is added to the graph shown in FIG. 11. As is clear from FIG. 13, according to the fifth modification, the color mixing characteristics are improved compared to those of the back-illuminated CIS 30 illustrated in FIG. 3.

Figure 14A:
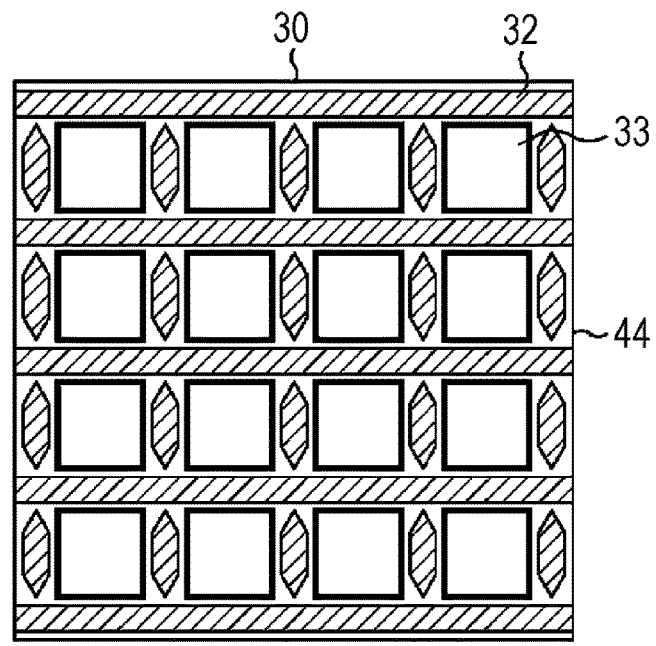
FIG. 14A illustrates an example of a sixth modification with modified trenches in accordance with embodiments of the present disclosure.
Figure 14B:
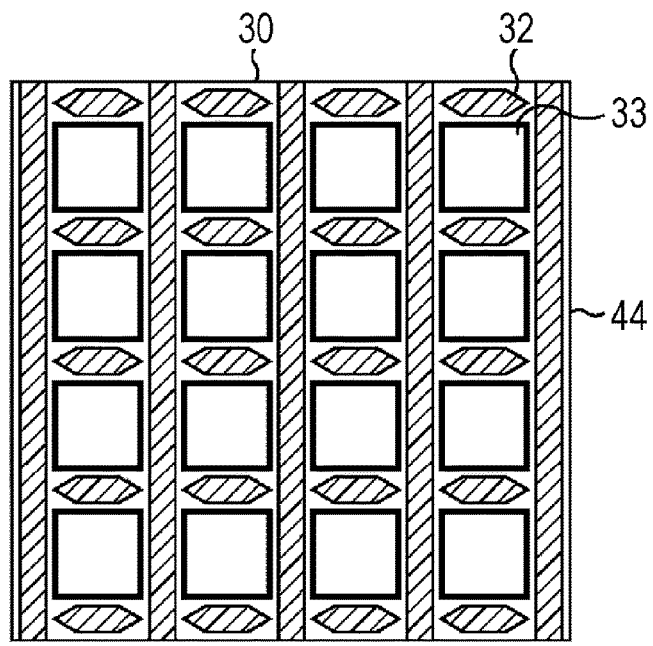
FIG. 14B illustrates another example of the sixth modification with modified trenches in accordance with embodiments of the present disclosure.

FIGS. 14A and 14B illustrate examples of embodiments of the present disclosure with modifications in which trenches that continuously extend in one of horizontal and vertical directions and trenches that intermittently extend in the other one of the horizontal and vertical directions are formed in a grid-shaped region that extends between the pixels. FIG. 14A shows the case in which trenches that continuously extend in the horizontal direction are formed. FIG. 14B shows the case in which trenches that continuously extend in the vertical direction are formed. When the trenches extending in the horizontal and vertical directions have different lengths as illustrated in FIGS. 14A and 14B, the trenches may have different depths. In such a case, the trenches extending in the horizontal and vertical directions may be formed so as to have the same depth by adjusting the widths of the trenches.

In either case, no trench crossing portions are provided. Therefore, the problems due to the trench crossing portions do not occur. Since the area in which no trenches are formed is reduced compared to that in the case of FIG. 3B, the color mixing characteristics are improved compared to those in the case of FIG. 3B. In the case of FIG. 14A, the light shielding performance between the pixels adjacent to each other in the up-down (vertical) direction can be improved compared to that in the case of FIG. 3B. In the case of FIG. 14B the light shielding performance between the pixels adjacent to each other in the left-right (horizontal) direction can be improved compared to that in the case of FIG. 3B.

Figure 15:
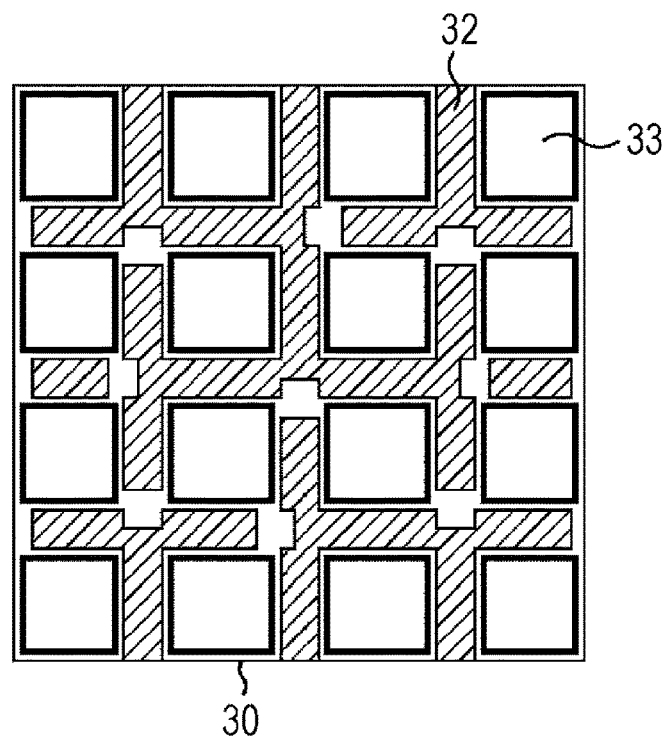
FIG. 15 illustrates a seventh modification with modified trenches in accordance with embodiments of the present disclosure.

FIG. 15 illustrates an embodiment of the present disclosure with a modification in which the trenches are formed so as to include portions having different widths so that the volume thereof does not increase at diagonal ends of each pixel.

Figure 16A:
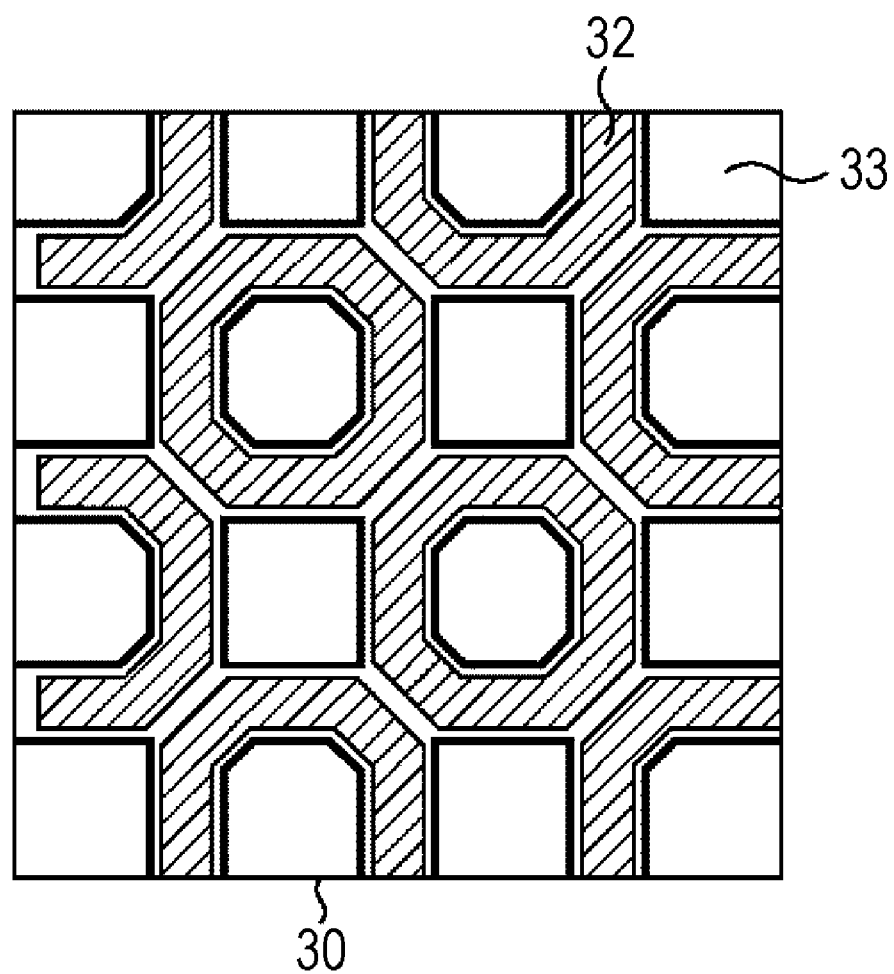
FIG. 16A illustrates an example of an eighth modification with modified trenches in accordance with embodiments of the present disclosure.
Figure 16B:
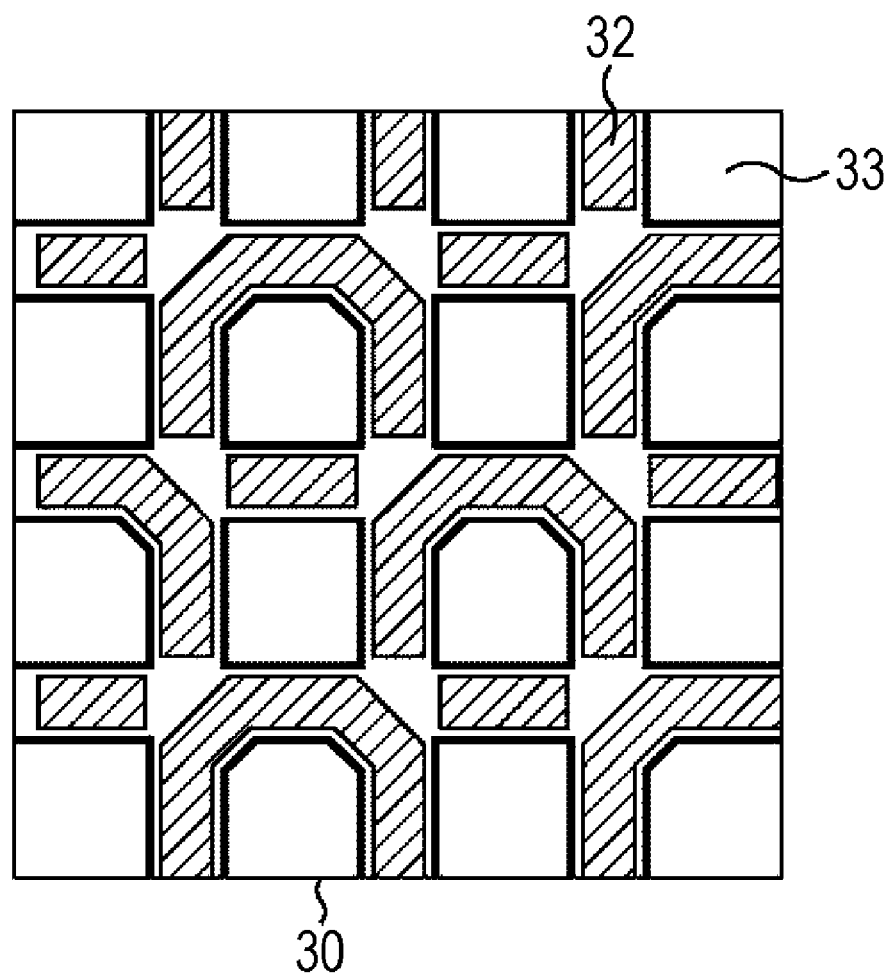
FIG. 16B illustrates another example of the eighth modification with modified trenches in accordance with embodiments of the present disclosure.

FIGS. 16A and 16B illustrate examples of embodiments of the present disclosure with modifications in which the trenches that cross each other are connected to each other at an angle less than or equal to a crossing angle (90 degrees) at diagonal ends of each pixel.

Figure 17:
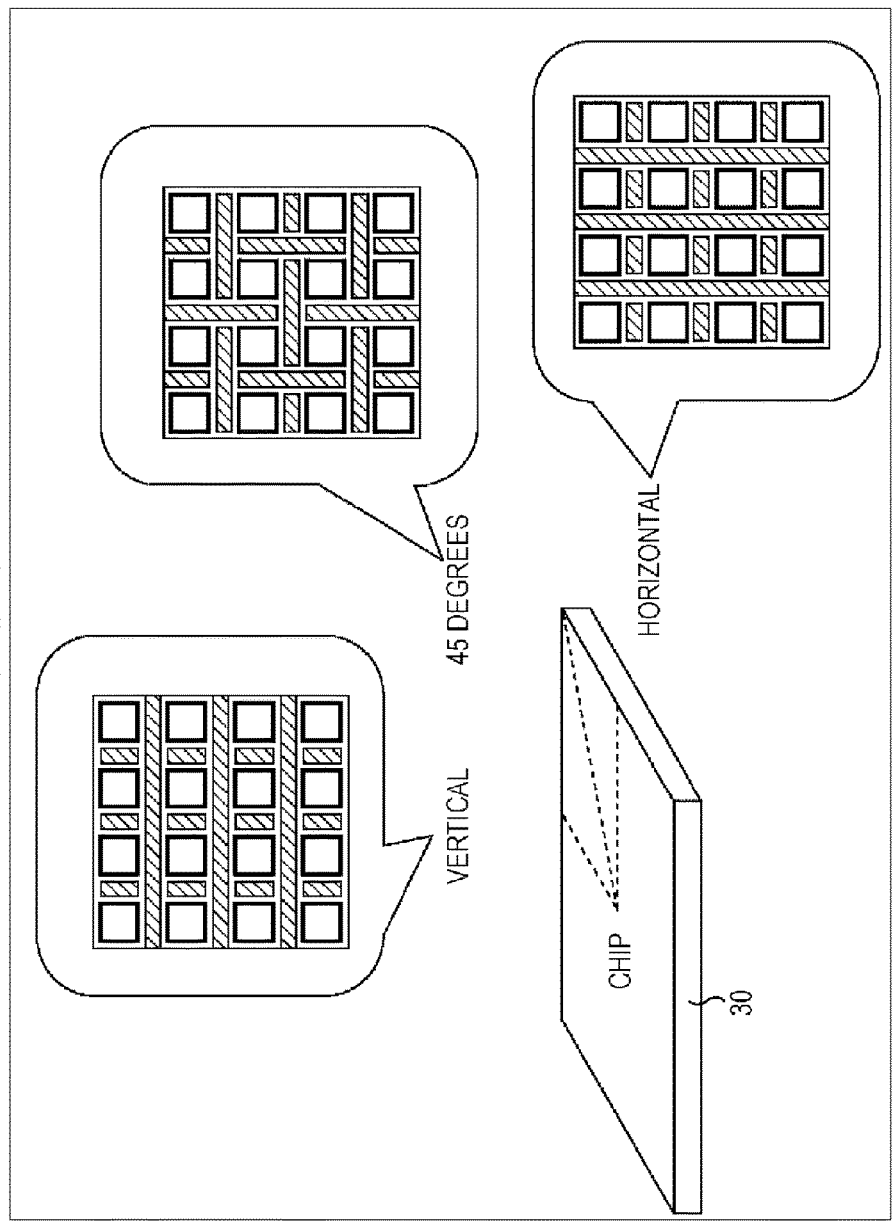
FIG. 17 illustrates an example of a ninth modification with modified trenches in accordance with embodiments of the present disclosure.
Figure 18A:
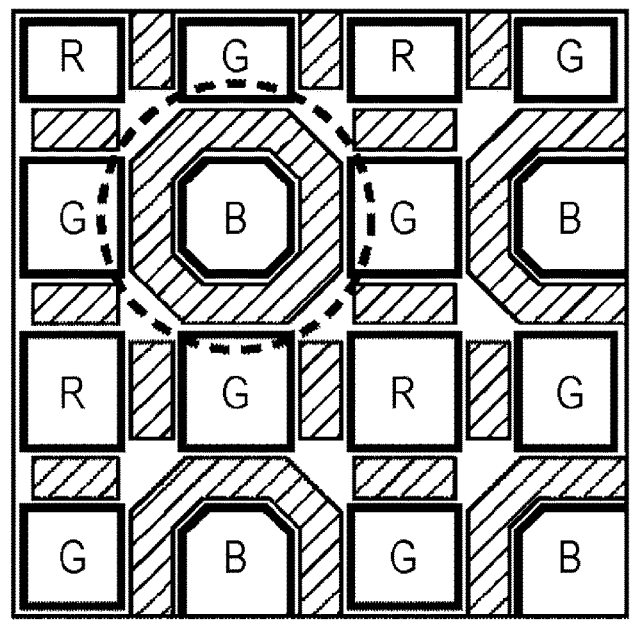
FIG. 18A illustrates another example of a tenth modification with modified trenches in accordance with embodiments of the present disclosure.
Figure 18B:
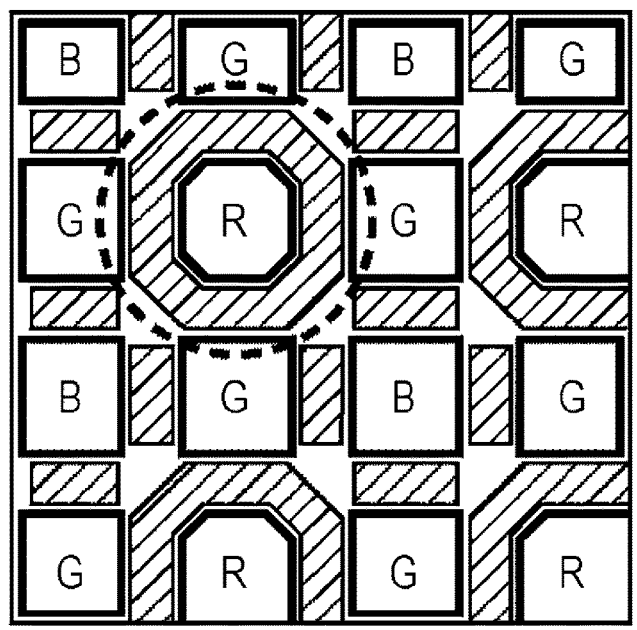
FIG. 18B illustrates another example of the tenth modification with modified trenches in accordance with embodiments of the present disclosure.
Figure 18C:
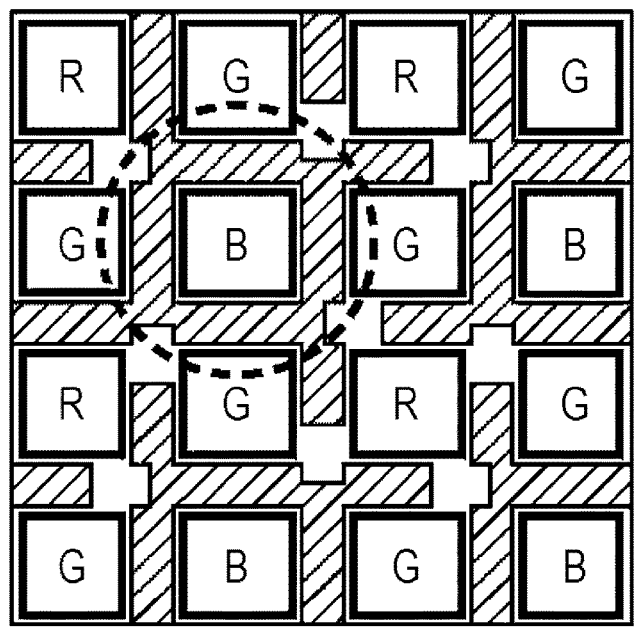
FIG. 18C illustrates another example of the tenth modification with modified trenches in accordance with embodiments of the present disclosure.
Figure 18D:
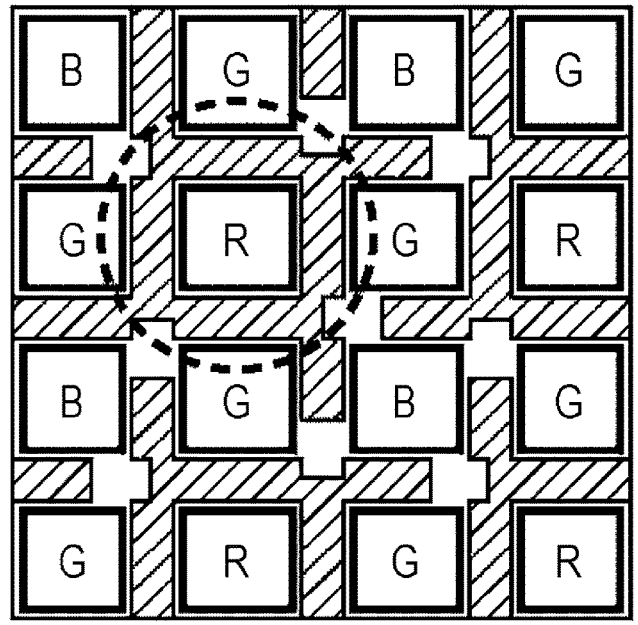
FIG. 18D illustrates another example of the tenth modification with modified trenches in accordance with embodiments of the present disclosure.
Figure 18E:
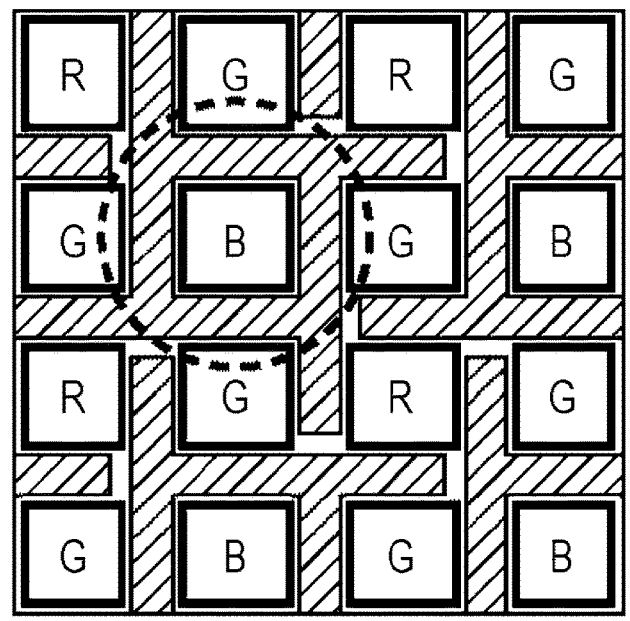
FIG. 18E illustrates another example of the tenth modification with modified trenches in accordance with embodiments of the present disclosure.
Figure 18F:
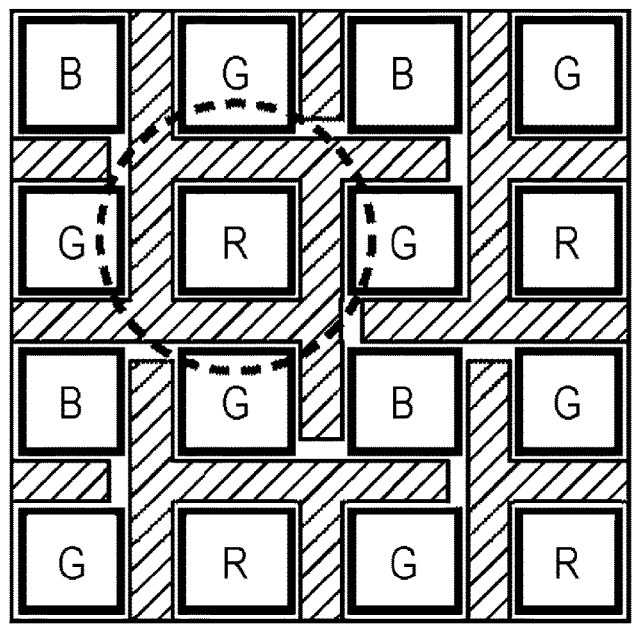
FIG. 18F illustrates another example of the tenth modification with modified trenches in accordance with embodiments of the present disclosure.

FIG. 17 illustrates embodiments of the present disclosure with modifications in which separation locations at which the trenches are separated into segments are changed in accordance with the view angle direction so that the trenches are not separated into segments at many locations with respect to a direction in which light is inclined.

FIGS. 18A to 18F show examples of embodiments of the present disclosure with modifications in which symmetry of the separation locations of the trenches is not set for each pixel and particular pixels (B pixels that receive light with the longest wavelength or R pixels that receive light with the shortest wavelength) are surrounded by the trenches.

The back-illuminated CIS 30 according to the present embodiment includes the color filter 42 in which the three primary colors are arranged in a Bayer pattern to output a color image signal. However, the three primary colors may instead be arranged in any pattern, including but not limited to a stripe pattern. In accordance with other embodiments, the color filter 42 may incorporate white filter elements. In accordance with still other embodiments, the color filter 42 may be omitted when a monochrome image signal is to be output.

In the back-illuminated CIS 30 according to the present embodiment, the trenches formed in the Si substrate 44 are filled with the light-shielding material. However, the trenches may have a hollow structure instead of being filled with the light-shielding material.

The back-illuminated CIS 30 according to the present embodiment may be installed not only in cameras, such as digital still cameras and digital video cameras, but also in smart phones, mobile phones, various personal computers, etc., having a function of capturing still and moving images.

It should be noted that the present disclosure can take the following configurations.

(1) An image pickup device, comprising:
a substrate;
a plurality of pixels formed in the substrate; and
a plurality of trenches formed in the substrate and extending at least partially between pairs of pixels included in the plurality of pixels, and wherein at least two trenches in the plurality of trenches are formed along at least a first line that extends between a plurality of pixels.
(2) The device of (1), wherein no two trenches cross one another.
(3) The device of (1), further comprising:
a substrate light shielding material, wherein the substrate light shielding material fills the plurality of trenches.
(4) The device of (3), wherein at least one pixel in the plurality of pixels is not completely surrounded by the substrate light shielding material.
(5) The device of (3), wherein the substrate light shielding material defines a perimeter that substantially surrounds each pixel in the plurality of pixels, and wherein with respect to each pixel in the plurality of pixels there is at least one gap in the perimeter formed by the substrate light shielding material.
(6) The device of (3), further comprising:
an upper layer light shielding material.
(7) The device of (6), wherein the upper layer light shielding material and the substrate light shielding material are made from an insulating material, the insulating material including at least one of silicon oxide, titanium oxide, silicon nitride, aluminum oxide, tantalum oxide, or hafnium oxide, or a metal material such a tungsten, aluminum, titanium nitride, titanium, or copper.
(8) The device of (1), wherein at least two trenches are formed along at least a second line that extends between a plurality of pixels.
(9) The device of (8), wherein the first line is one of parallel to and perpendicular to the second line.
(10) The device of (1), wherein the plurality of pixels are arranged in rows and columns, and wherein the first line extends between one of two adjacent rows of pixels and two adjacent columns of pixels.
(11) The device of (10), wherein each pixel is associated with at least four trenches, and wherein between diagonally opposed pairs of pixels no trench intersects any other trench.
(12) An image pickup device, comprising:
a substrate;
a plurality of pixels; and
a plurality of trenches formed in the substrate, wherein at least some of the trenches are between adjacent pairs of pixels, and wherein no one trench extends across any other trench.
(13) The device of (12), wherein at least some of the trenches included in the plurality of trenches are formed along a first plurality of parallel lines, and wherein more than one trench included in the plurality of trenches is formed along each line in the first plurality of lines.
(14) The device of (13), wherein at least some of the trenches are formed along a second plurality of parallel lines, and wherein only one trench is formed along each line in the second plurality of lines.
(15) The device of (13), wherein the plurality of pixels are arranged in rows and columns, and wherein the first plurality of parallel lines extend between one of adjacent rows of pixels and adjacent columns of pixels.
(16) The device of (12), further comprising:
a substrate light shielding material, wherein the trenches in the plurality of trenches are filled with the substrate light shielding material.
(17) The device of (16), further comprising:
an upper layer light shielding material, wherein the upper layer light shielding material extends between the pixels.
(18) The device of (17), wherein the substrate light shielding material and the upper layer light shielding material are made of an insulating material including at least one of silicon oxide, titanium oxide, silicon nitride, aluminum oxide, tantalum oxide, or hafnium oxide, or a metal material such a tungsten, aluminum, titanium nitride, titanium, or copper.
(19) A back-illuminated image pickup element, comprising:
a trench provided between adjacent pixels to block obliquely incident light, the trench having a separation location at which the trench is separated into segments.
(20) The image pickup element according to (19), wherein the separation location is provided in a crossing region in which a region that vertically extends between horizontally adjacent pixels and a region that horizontally extends between vertically adjacent pixels cross each other.
(21) The image pickup element according to (20), wherein the trench includes a horizontal trench and a vertical trench, and a plurality of the separation locations are symmetrically arranged such that the separation locations are provided at every other pixel in each of the horizontal and vertical trenches.
(22) The image pickup element according to (20), wherein the trench includes a horizontal trench and a vertical trench, and a plurality of the separation locations are symmetrically arranged such that the separation locations are provided at every pixel in one of the horizontal and vertical trenches and no separation locations are provided in the other of the horizontal and vertical trenches.
(23) The image pickup element according to (20), wherein a plurality of the separation locations are not symmetrically arranged, and
wherein the pixels include a pixel that receives light with a longest or shortest wavelength among wavelengths of light receivable by the image pickup element and that is located so as to be surrounded by the trench.
(24) The image pickup element according to (20), wherein the trench is filled with a light-shielding material.
(25) The image pickup element according to (24), further comprising:
a charge-fixed film provided on a side wall of the trench.
(26) An image pickup device, comprising:
an image pickup unit including a back-illuminated image pickup element including a trench provided between adjacent pixels to block obliquely incident light, the trench having a separation location at which the trench is separated into segments.

The present disclosure contains subject matter related to that disclosed in Japanese Priority Patent Application JP 2012-117194 filed in the Japan Patent Office on May 23, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 30 back-illuminated CIS
31 Si-upper-layer light-shielding material
32 Si-substrate light-shielding material
33 pixel
34 P-type diffusion layer
35 N-type diffusion layer
41 on-chip lens
42 color filter
43 Si upper layer
44 Si substrate
45 wiring layer
51 charge-fixed film

What is claimed is:

1. An image pickup device, comprising:
a substrate;
a plurality of pixels in the substrate; and
a plurality of non-intersecting trenches in the substrate,
wherein the plurality of non-intersecting trenches are between adjacent pixels of the plurality of pixels,
wherein at least two trenches of the plurality of non-intersecting trenches are along a first line of one of:
a vertical line between two adjacent columns of pixels of the plurality of pixels, or
a horizontal line between two adjacent rows of pixels of the plurality of pixels, and
wherein a single trench of the plurality of non-intersecting trenches is along a second line of the one of the vertical line or the horizontal line.

2. The image pickup device of claim 1, further comprising a substrate light shielding material in the plurality of non-intersecting trenches.

3. The image pickup device of claim 2, wherein at least one first pixel in the plurality of pixels is partially surrounded by the substrate light shielding material.

4. The image pickup device of claim 2, wherein the substrate light shielding material defines a perimeter that extends along at least two sides of each pixel in the plurality of pixels.

5. The image pickup device of claim 2, further comprising an upper layer light shielding material.

6. The image pickup device of claim 5,
wherein each of the upper layer light shielding material and the substrate light shielding material comprises one of an insulating material or a metal material,
wherein the insulating material comprises at least one of silicon oxide, titanium oxide, silicon nitride, aluminum oxide, tantalum oxide, or hafnium oxide, and
wherein the metal material comprises at least one of tungsten, aluminum, titanium nitride, titanium, or copper.

7. The image pickup device of claim 1, wherein at least one of the plurality of non-intersecting trenches comprises pointed ends.

8. The image pickup device of claim 1, wherein at least one of the plurality of non-intersecting trenches comprises flat ends.

9. An image pickup device, comprising:
a substrate;
a plurality of pixels in the substrate; and
a plurality of non-intersecting trenches in the substrate,
wherein the plurality of non-intersecting trenches are between adjacent pixels of the plurality of pixels,
wherein a size of each of the plurality of non-intersecting trenches is greater than or equal to a size of a side of each of the plurality of pixels, and
wherein a first group of trenches of the plurality of non-intersecting trenches is along a first direction of one of a horizontal direction or a vertical direction, and
wherein a second group of trenches of the plurality of non-intersecting trenches is along a second direction of the one of the horizontal direction or the vertical direction.

10. The image pickup device of claim 9,
wherein the first group of trenches is along a first plurality of parallel lines, and
wherein at least two trenches are along each line in the first plurality of parallel lines.

11. The image pickup device of claim 10,
wherein the second group of trenches is along a second plurality of parallel lines, and
wherein only one trench is along each of the second plurality of parallel lines.

12. The image pickup device of claim 10, further comprising an array of the plurality of pixels in rows and columns,
wherein the first plurality of parallel lines extend between one of adjacent rows of pixels or adjacent columns of pixels.

13. The image pickup device of claim 9, further comprising a substrate light shielding material in the plurality of non-intersecting trenches.

14. The image pickup device of claim 13, further comprising an upper layer light shielding material between the adjacent pixels.

15. The image pickup device of claim 14,
wherein each of the substrate light shielding material and the upper layer light shielding material comprises one of an insulating material or a metal material,
wherein the insulating material comprises at least one of silicon oxide, titanium oxide, silicon nitride, aluminum oxide, tantalum oxide, or hafnium oxide, and
wherein the metal material comprises at least one of tungsten, aluminum, titanium nitride, titanium, or copper.

16. An imaging device, comprising:
a substrate;
a plurality of pixels in the substrate;
a plurality of non-intersecting trenches in the substrate,
wherein the plurality of non-intersecting trenches are between adjacent pixels of the plurality of pixels,
wherein a size of each of the plurality of non-intersecting trenches is greater than or equal to a size of a side of each of the plurality of pixels,
wherein a first group of trenches of the plurality of non-intersecting trenches is along a first direction of one of a horizontal direction or a vertical direction, and
wherein a second group of trenches of the plurality of non-intersecting trenches is along a second direction of the one of the horizontal direction or the vertical direction; and
a substrate light shielding material in the plurality of non-intersecting trenches,
wherein the substrate light shielding material defines a perimeter along each pixel of the plurality of pixels.

17. The imaging device of claim 16, wherein the plurality of pixels are in rows and columns in a light incident side of the substrate.

18. An image pickup device, comprising:
a substrate;
a plurality of pixels in the substrate; and
a plurality of non-intersecting trenches in the substrate,
   wherein the plurality of non-intersecting trenches are between adjacent pixels of the plurality of pixels,
   wherein each of the plurality of non-intersecting trenches is along one of a horizontal direction or a vertical direction,
   wherein a first group of trenches of the plurality of non-intersecting trenches are along a first plurality of parallel lines,
   wherein more than one trench is along each of the first plurality of parallel lines,
   wherein a second group of trenches of the plurality of non-intersecting trenches is along a second plurality of parallel lines, and
   wherein only one trench is along each of the second plurality of parallel lines.

* * * * *